(12) United States Patent
Chen

(10) Patent No.: US 7,342,462 B1
(45) Date of Patent: Mar. 11, 2008

(54) QUADRATURE LC VOLTAGE CONTROLLED OSCILLATOR WITH OPPOSED BIAS AND COUPLING CONTROL STAGES

(75) Inventor: Jinghong Chen, Basking Ridge, NJ (US)

(73) Assignee: Agere Systems, Inc., Allentown, PA (US)

( * ) Notice: Subject to any disclaimer, the term of this patent is extended or adjusted under 35 U.S.C. 154(b) by 49 days.

(21) Appl. No.: 11/462,180

(22) Filed: Aug. 3, 2006

(51) Int. Cl.
*H03B 5/12* (2006.01)
*H03B 27/00* (2006.01)
*H03L 7/24* (2006.01)

(52) U.S. Cl. .............................. 331/45; 331/48; 331/55; 331/117 FE; 331/177 V; 331/185

(58) Field of Classification Search ............... 331/36 C, 331/45, 46, 48, 55, 172, 177 V, 185, 186, 331/117 R, 117 FE, 117 D
See application file for complete search history.

(56) References Cited

U.S. PATENT DOCUMENTS 6,417,740 B1* 7/2002 Anh et al. ..................... 331/48
6,462,626 B1* 10/2002 Gharpurey ............... 331/108 B
7,146,140 B2* 12/2006 Ravi et al. .................. 455/146
2002/0093385 A1* 7/2002 Nishiyama et al. ........... 331/46

OTHER PUBLICATIONS

Madala; "Design of Wide-Band VCO using Mixed Tuning Technique". Dept. of Comp. Sci. and Elec.; Mälardalen Univ., Västerås, Sweden.
Aparicio et al.; "A CMOS Differential Noise-Shifting Colpitts VCO". ISSCC 2002.
Hajimiri et al.; "Design Issues in CMOS Differential LC Oscillators". IEEE Jnl of Solid State Circuits, vol. 34, No. 5 (1999).
Song et al.; "A 5GHz Transformer-Coupled CMOS VCO Using Bias-Level Shifting Technique". IEEE (2004).
Andreani et al.; "Tail Current Noise Suppression in RF CMOS VCOs". IEEE (2002).
Zhan et al.; A Comparative Study of Common MOS VCO Topologies; Cornell Univ. Ithaca, NY.

* cited by examiner

*Primary Examiner*—David Mis
(74) *Attorney, Agent, or Firm*—Duane Morris LLP

(57) ABSTRACT

A voltage controlled oscillator unit is provided with cross coupled voltage controlled oscillators to generate quadrature phases. One control stage adjusts coupling between the oscillators. Another control stage adjusts the tail current that applies operating bias to the oscillators and to the couplers, respectively. The cross coupling and tail current control stages are arranged so that tuning one simultaneously and oppositely tunes the other for simultaneous adjustment in opposite directions. This limits the power consumption of the oscillator unit throughout the range of frequency control.

10 Claims, 3 Drawing Sheets

(a) Resonator impedance Z. (b) Magnitude |Z| and phase f(Z) responses.

QUADRATURE LC VOLTAGE CONTROLLED OSCILLATOR WITH OPPOSED BIAS AND COUPLING CONTROL STAGES

FIELD OF THE INVENTION

The invention concerns a solid state voltage-controlled oscillator arrangement with two oscillator stages coupled by switching elements so as to generate quadrature phase outputs. In addition to switching elements that operate alternately to couple and decouple the oscillator stages, additional switching elements are provided alternately to apply or to decouple operational bias that produces tail current. The stage-coupling and tail current switching elements operate in phase with one another but in opposite directions. The result is reduced overall power consumption.

BACKGROUND

It is known to couple together two substantially identical resonant LC voltage controlled oscillators (VCO) as a unit that produces quadrature outputs. The oscillation frequency of the unit can be tuned by adjusting the coupling coefficients between the two oscillators.

FIG. 3, labeled "prior art," is a block diagram schematic showing two coupled LC oscillators. Each has a positive feedback loop with a transfer function "$G_i$" between a respective input and an output coupled back to the input. The outputs of the two oscillators respectively are each coupled to a summing node at the input of the other oscillator, through a controllable coupling block. The coupling coefficients of these blocks are scalar factors $m_1$ and $m_2$. The outputs are shown as signals X and Y, which are to be quadrature-phase related signals at a nominal oscillation frequency.

In this arrangement, assuming steady state oscillation wherein the two oscillators are synchronized to a single oscillation frequency w, the outputs of the two oscillators must satisfy the following equations:

$$(X+m_2Y)G_1(j\omega)=X$$

$$(Y+m_1X)G_2(j\omega)=Y$$

The two VCOs are identical, and can be assumed to have equal transfer functions ($G_1=G_2=G$). Further assuming equal coupling coefficients ($m_1=-m_2=m$), then it can be shown that $X^2+Y^2=0$, and therefore, $X=\pm jY$. This demonstrates that the coupled identical oscillators as shown and described produce quadrature outputs X and Y. Substituting $X=\pm jY$ into one of the foregoing equations produces:

$$(1\pm jm)G(j\omega)=1$$

The impedance $Z(j\omega)$ of the oscillator resonator is proportional to $G(j\omega)$ the gain of the oscillator stage. There are two possible oscillation frequencies, $\omega_1$ and $\omega_2$, namely where $$\phi(Z(j\psi_1))=-\tan^{-1} m \text{ and } \phi(Z(j\omega_2))=\tan^{-1} m$$

For a typical resonator with a lossy inductor having a tank arrangement as modeled in FIG. 4 (also labeled as prior art), an impedance magnitude peak occurs at a frequency higher than the resonator frequency:

$$\omega_0 = \frac{1}{2\pi\sqrt{LC}}\sqrt{1-\frac{CR_S^2}{L}}$$

Assuming that a stable oscillation is obtained at one frequency $\omega_1$ associated with the impedance peak (which inherently requires a loop gain of unity and a 180 degree phase difference), then a sustained oscillation at a second frequency $\omega_2$ is not possible because the loop gain is less than unity at frequencies other than $\omega_1$. A stable oscillation is obtained just at one frequency. Based on the foregoing equations, stable oscillation is obtained where $(1+jm)G(j\omega)=1$ and the oscillation frequency at $\omega_1$ is determined by $\omega(Z(j\omega))=-\tan^{-1} m$. These relationships suggest that the oscillation frequency of the coupled oscillators can be tuned from a frequency $\omega_0$ to a frequency $\omega_1$ as defined, by varying the coupling coefficients ($m_1=-m_2$) between zero and m. The output frequency can be tuned to a selected point in a frequency range by varying the coupling coefficient between the two LC oscillators (i.e., by varying the absolute value of the coupling coefficient up to a maximum m).

The frequency tuning range is determined by the phase-frequency characteristics of $G(j\omega)$ and by the range of deviation of the coupling coefficient m. An upper bound of m is reached at a limit resulting from phase noise performance. A lower bound of m is reached due to a multi-mode oscillation phenomenon. In practice it is not possible to have two perfectly-matched oscillators. Each oscillator will have a slightly different natural oscillation frequency (i.e., when no coupling is applied). If the extent of coupling (m) is made smaller and smaller, a point is reached when the coupling becomes too weak to prevent the oscillators from seeking their different natural frequencies, giving rise to a multi-tone output signal as a result of nonlinear limiting in the feedback loops. The minimum value of the coupling coefficient m is a function of the extent of mismatch between $G_1$ and $G_2$.

Generally, the aim of an LC oscillator of this type (i.e., either single LC oscillator as opposed to the coupled pair) is to provide NMOS and/or PMOS cross coupled transistor pairs that switch between conducting and nonconducting states at a frequency determined by the resonant tank circuit. The pairs are arranged so as to shift currents back and forth between capacitive and inductive elements in a complementary way. Some energy is lost in every cycle, including energy dissipated in parasitic resistances of the LC tank. As a result, an LC resonator by itself could not maintain steady oscillation over time. However, in an appropriate configuration, cross-coupled differential transistors can provide the negative resistance necessary to replenish the energy that is lost. Oscillation can continue indefinitely.

In order to provide stable oscillation, the negative resistance (or transconductance) of such an oscillator must cancel out the energy dissipated by the resonant LC tank. To ensure start-up oscillation, transconductances are advantageously chosen to be two or three times the minimal acceptable value. To provide transconductance as necessary, the VCO necessarily dissipates a current. The serial current through each VCO is known as the VCO "tail current." The transconductance value is proportional to the square-root of the tail current.

In the cross coupled oscillator stage described above, the tuning elements that control the coupling coefficients between the two stages ($m_1=-m_2$) between zero and m, likewise require bias and contribute to the current load on the power supply. The bias on the coupling and switching controls produces a bias current that can be termed the coupling circuit tail current.

In a known VCO unit described in "A 6.5 GHz monolithic CMOS voltage controlled oscillator," Liu T. P., et al., ISSCC, February, 1999, pp. 404-405, a technique is disclosed wherein transistor elements vary the extent of coupling between two VCO stages, for tuning the frequency of the coupled pair. A control voltage is applied to the transistor coupling elements for obtaining a selected coupling coefficient in a tuning range. The VCO tail currents of the coupled oscillators are equal because the oscillators are equal (insofar as practically possible). The tail currents dissipated by two couplers are equal because the coupling coefficients have equal absolute values (m1=−m2). As discussed in Liu T. P.'s paper, the coupling coefficient $m=(I_1/I_0)^n$, where $I_1$ is the coupler tail current, $I_0$ is the VCO tail current, and n=0.5 to 1.0. In the Liu paper, $I_1$ is tuned; and $I_0$ remains constant. The coupling elements may carry more or less coupling circuit tail current, depending on the point at which the circuit happens to be tuned in its operational range. The VCO tail currents and the coupling circuit tail currents both load the power supply. Under tuning conditions where the coupling circuit tail current is high, the sum of the constant VCO tail current and the variable coupling circuit tail current may be such that the device dissipates considerable power.

What is needed is a way to control oscillation frequency that is similarly convenient, i.e., by controlling the driving current applied to coupling components, without suffering undue tail current dissipation in the steady state and/or at any particular operational state over a tuning range.

SUMMARY OF THE INVENTION

It is an aspect of the invention to provide a cross coupled VCO oscillator pair wherein the coupling coefficients on cross coupled paths between two complementary PMOS/NMOS switches are controlled and switched synchronously with oscillation. The oscillators produce periodic outputs at a controllable frequency, in quadrature phase relationship. According to an inventive aspect, VCO tail current levels and coupler circuit tail current levels are balanced against one another by sharing a current mirror control wherein two sides share a current supply in a manner that when one of the coupler circuit and an associated VCO is driven to increase its tail current level, the other of the coupler circuit and VCO is driven to decrease its tail current. The two are driven in a coordinated manner in opposite directions. In this way, the sum of the tail currents of the coupler circuit and VCO are controlled over the range of frequency control, instead of providing points in the control ranges wherein the total current dissipation is distinctly higher that at other points, due to driving the coupler circuit particularly hard.

The invention couples the two types of elements leading to tail current and associated power dissipation, namely VCO tail current controls and coupling circuit tail current controls, and balances the VCO and coupling circuit controls against one another. A tuning variation leading to increased tail current and power dissipation in one type, causes decreased tail current and power dissipation in the other, and vice versa. In a device of this type as described in the background, the coupling coefficient is related to the ratio of coupler tail current to VCO tail current (i.e., $m=(I_1/I_0)^n$, where $I_1$ is the coupler tail current, $I_0$ is the VCO tail current). According to the invention, when tuning for an increase in the coupling coefficient, an increase in coupler tail current and a decrease in VCO tail current, both contribute toward the desired increase in the coupling coefficient. Likewise, a decrease in coupler tail current and an increase in VCO tail current both contribute toward a decrease in the coupling coefficient. Good tuning capability is achieved while limiting total power dissipation over the full operational range.

The invention permits efficient generation of quadrature oscillation signals over a control range while limiting the total biasing current of the oscillator pair and its associated coupling elements.

BRIEF DESCRIPTION OF THE DRAWINGS

There are shown in the drawings certain exemplary and nonlimiting embodiments of the invention as presently preferred. Reference should be made to the appended claims, however, in order to determine the scope of the invention in which exclusive rights are claimed. In the drawings.

DETAILED DESCRIPTION OF PREFERRED EMBODIMENTS

Figure 1:
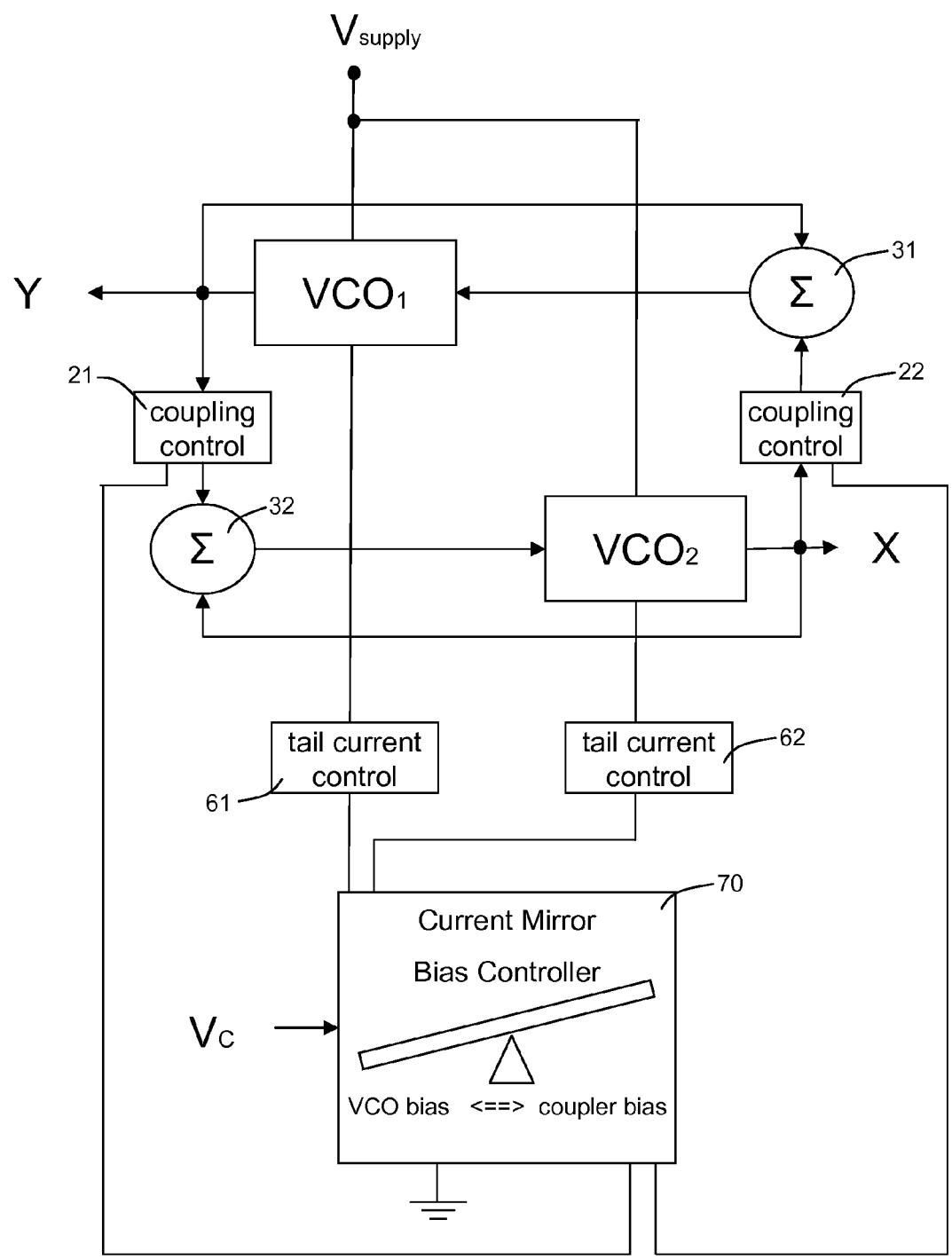
FIG. 1 is a schematic block diagram illustrating quadrature cross coupled voltage controlled oscillators (VCOs) according to the invention.
Figure 2:
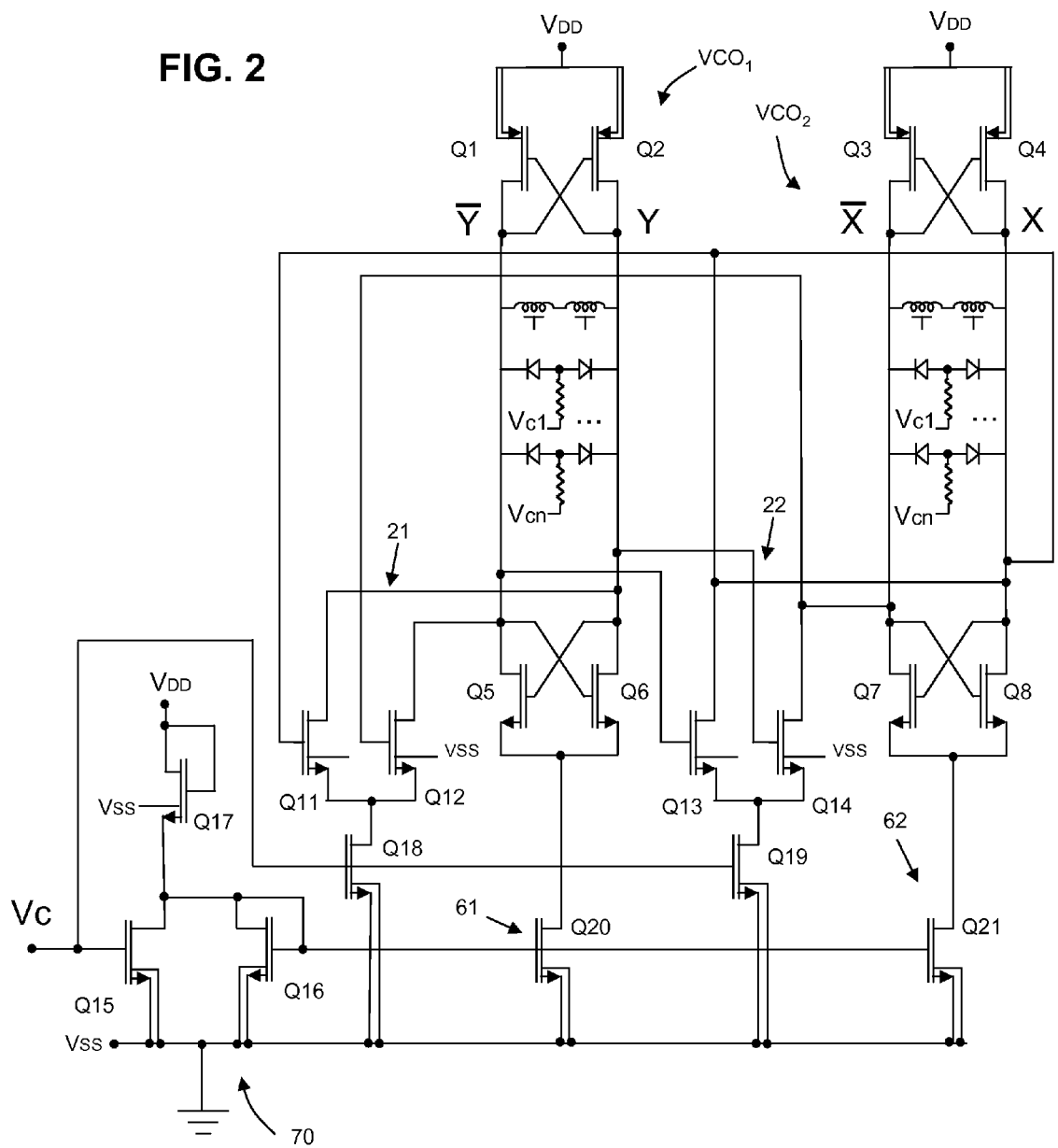
FIG. 2 is a schematic illustration of quadrature cross coupled voltage controlled oscillators (VCOs) according to the invention.

FIG. 1 is a block diagram that illustrates the structure and function of the invention. FIG. 2 is a schematic diagram illustrating a practical embodiment.

A pair of voltage controlled oscillators $VCO_1$ and $VCO_2$ are connected to one another including through couplers 21, 22, so as to operate as described in the background section above, producing two quadrature outputs X and Y, namely periodic signals that are synchronous but 90 degrees out of phase. The frequency of the outputs is controlled by a control voltage input Vc, the same voltage input level defining the maximum coupling proportion at both couplers 21, 22 associated with summing nodes 31, 32.

As shown in FIG. 2, each of the two VCOs can comprise a cross-coupled differential pair amplifier and an LC resonant tank. The transistor members of the cross-coupled pairs, for example Q1 and Q2, and Q5 and Q6 (for $VCO_1$) behave like an amplifier and provide negative resistance sufficient to compensate for the LC tank parasitic resistance loss. Two loops couple the two LC oscillators so as to generate quadrature VCO outputs, with frequency tuning provided by varying the coupling coefficient m. The coupling coefficient is equal for coupling $VCO_1$ to $VCO_2$ and vice versa, but with negative sign relationship (m1=−m2), achieved by properly connecting the VCO outputs to the coupler circuit inputs as shown in FIG. 2. The outputs of oscillators $VCO_1$ and $VCO_2$ are synchronous and in quadrature phase relationship, at a frequency determined by varying the coupling coefficient m as discussed in the background section above. The coupling coefficient is varied over a control range by varying the applied input control voltage Vc.

In addition to the capability of selecting a frequency in a range by varying the coupling coefficient through the applied control voltage Vc, in the example shown, the varactor value is likewise controllable, e.g. varying the capacitance of the varactor through one or more control voltage inputs Vc1 . . . Vcn can provide additional tuning by changing the basic period $\omega_0$. The VCO can have a substantial tuning range by combining these two tuning capabilities. However, this disclosure focuses on varying the coupling coefficient rather than varactor capacitance to illustrate the inventive technique for frequency control with limited power consumption.

As shown in FIG. 2, couplers 21, 22 can be configured as analog differential pair amplifiers. Coupler 21 takes $VCO_2$'S output as input, and coupler 21's output is connected to $VCO_1$. Thus, coupler 21 couples $VCO_2$ to $VCO_1$. The extent of coupling $m=g_{m11,12}/g_{m5,6}$ which is proportional to the square root of $(I_{18}/I_{20})$, where $I_{18}$ is the current flowing through transistor Q18 (e.g., the coupler circuit tail current), and $I_{20}$ is the current flowing through transistor Q20 (e.g., the $VCO_1$ tail current). The expression "$g_{m\ n}$" is the transconductance of transistor #n). Coupler 22 operates in a comparable manner to couple $VCO_1$ to $VCO_2$.

According to an aspect of the invention, the coupling coefficient m is tuned in a power conserving manner. In a preferred embodiment, if $I_{18}$ is increased by a tuning variation in input Vc, that same variation causes $I_{20}$ to be decreased at the same time (and vice versa). The coupling coefficient m is proportional to the square root of the ratio $I_{18}/I_{20}$. Therefore, either increasing $I_{18}$ or decreasing $I_{20}$ will increase the coupling coefficient m. The invention provides a control that does both, enhancing the extent that such a control change increases the coupling coefficient, while limiting total power consumption. (Similarly, decreasing $I_{18}$ and/or increasing $I_{20}$ decreases the coupling coefficient while limiting power consumption.) Changing the coupling coefficient (tuning m) varies the oscillation frequency of the two VCOs as discussed in the background section above. The VCO frequency can be adjusted continuously to set a desired frequency over a tuning range.

In the embodiment shown, the tail current levels coupled to oscillators $VCO_1$ and $VCO_2$ are controlled by transistors Q20, Q21, in series with the VCOs across the power supply voltages (shown, for example, as a more positive level $V_{DD}$ and a more negative level at ground potential. The tail current levels available to the coupling control differential amplifier pair Q11, Q12 is controlled by transistor Q18. The tail current for differential amplifier pair Q13, Q14 is controlled by transistor Q19.

FIG. 1 generally shows a common controller 70, which serves to balance the bias applied to the couplers, which are also subject to the VCO frequency control input Vc, versus the bias applied to the VCOs. More particularly, controller 70 balances the biasing of these two categories (coupling coefficient controls 21, 22 versus VCO tail current controls 61, 62) so that when one is increased, the other is decreased, and vice versa.

FIG. 2 shows the circuit level implementation of the invention. Insofar as possible, the reference numbers employed in FIG. 1 are used to identify the same elements in FIG. 2. Two identical LC oscillators $VCO_1$ and $VCO_2$ are provided. In this embodiment, the oscillators comprise PMOS and NMOS transistors in complementary pairs (Q1-Q2 with Q5-Q6, and Q3-Q4 with Q7-Q8). The cross coupled PMOS and NMOS pairs provide a negative resistance to cancel the parasitic loss of the LC resonant tank. It would be possible to use either PMOS or NMOS pairs in a similar embodiment. However using both PMOS and NMOS pairs provides good negative resistance and better VCO phase noise characteristics.

Figure 3:
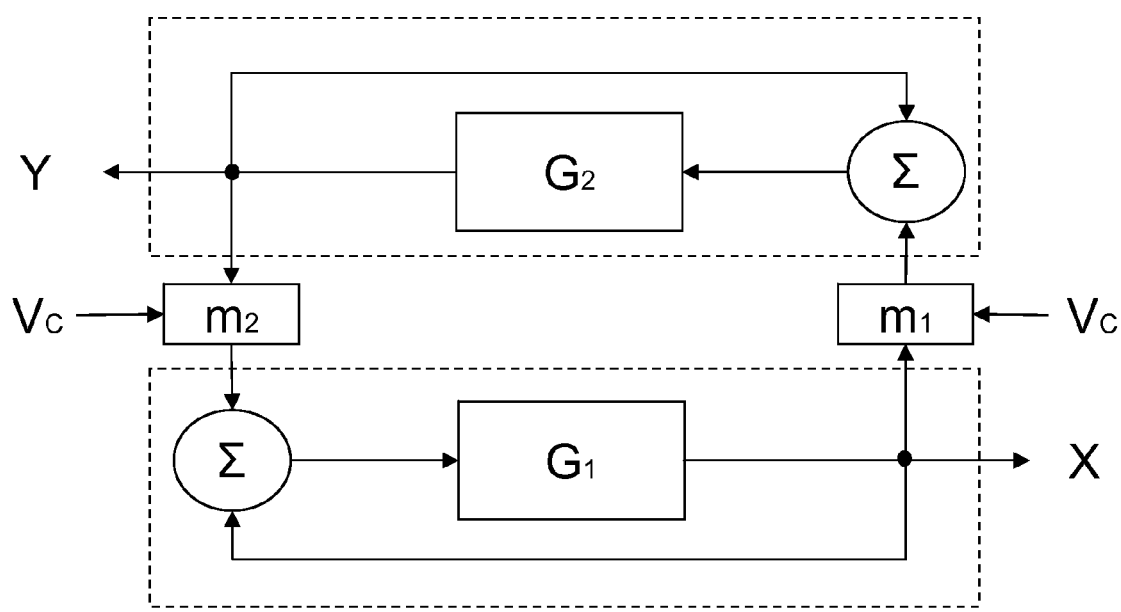
FIG. 3 is a block diagram, labeled "prior art," used in explaining the general operation of cross coupled quadrature VCOs with tunable coupling paths as provided in the background section above.
Figure 4:
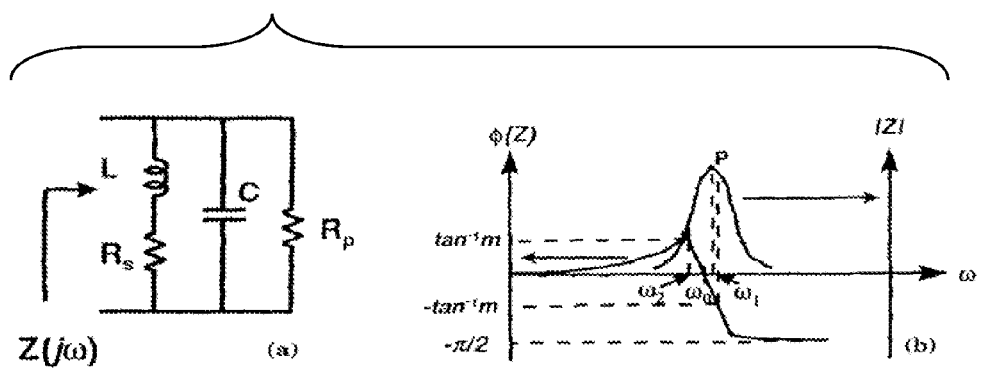
FIG. 4, also labeled "prior art," is an excerpt of illustrations from a published technical description of the theory of cross coupled quadrature VCOs, namely "A 6.5 GHz monolithic CMOS voltage controlled oscillator," Liu T. P., et al., ISSCC, February, 1999, pp. 405.

The LC tank circuits alternately shift between accumulation and discharge of electric charge versus current in capacitive and inductive elements, substantially in a manner known with respect to oscillators of this type. The two oscillators are cross coupled to produce quadrature outputs. The oscillators operate in a manner reflected generally by FIGS. 1 and 3 and discussed in the background section above.

Each oscillator $VCO_1$ and $VCO_2$ operates as an amplifier with a transfer function G1, G2. The transfer functions are equal (G1=G2). The coupling coefficients of coupling paths m1, m2 between the VCOs are also equal (m1=−m2=m). Two outputs X and Y are produced at the same frequency, 90 degrees out of phase (i.e., quadrature phase related synchronous signals). The frequency of the output can be determined by changing the coupling coefficients via a control input Vc, as shown in FIG. 2.

In FIG. 2, the coupling between the two oscillators $VCO_1$ and $VCO_2$ is provided by NMOS transistors Q11, Q12, Q13, Q14. Transistors Q11, Q12 form a differential pair that is in series with a coupler tail current control transistor Q18 and together form coupler control 21. Likewise, transistors Q13, Q14 form a differential pair in series with Q19 in coupler control 22. Current levels are controlled by input Vc. The current in Q18 and Q19 is determined in part by the transconductance of the coupler circuits 21 and 22. The variation in control voltage (Vc in FIG. 1) defines the span of the coupling coefficient and thus the VCO tuning frequency range.

The VCO tail current control 61 comprises transistor Q20, coupled between the VCO transistors Q5, Q6 and the negative supply voltage Vss. The VCO tail current control 62 likewise comprises transistor Q21, coupled to VCO transistors Q7, Q8.

The coupling coefficient "m" is varied to tune the frequency. The coupling coefficient is tuned by the control voltage Vc. The coupling coefficient is given by $m=g_{m11,12}/g_{m5,6}=g_{m\ 13,14}/g_{m7,8}$. The coupling coefficient also is proportional to the square root of the ratio of the coupler circuit tail current to the VCO tail current. (As noted above, "$g_{m\ n}$" refers to the transconductance of transistor #n.)

Thus the coupling coefficients are determined by the control voltage Vc, applied to transistors Q17, Q15, Q16. The coupler circuit tail currents in Q18 and Q19 are mirrored from the current in Q15. The VCO tail currents in Q20 and Q21 are mirrored from the current from Q16.

The VCO tail current and the coupling circuit tail current conventionally would be independent variables. Assuming a given VCO tail current, then an increase in coupling tail current results in a higher coupling coefficient but does not inherently require a change in the VCO tail current. Such an approach can result in greater power consumption than the approach taken according to the present invention, where increasing the coupling tail current also decreased the VCO tail current. The permits the VCO to cover a large range of m without consuming excessive power.

One aspect is to ameliorate the possibility that varying coupling of the oscillation signals between the VCOs by varying the tail current at the coupling controls 21, 22 alone, could result in a relatively high coupler tail current when the coupling coefficient is at its maximum. This is simply to say that the coupling controls will dissipate more current when driven harder and less current when not driven so hard, which seems a foregone conclusion. However according to the invention, an increase or decrease in the bias of the coupling control is balanced, respectively, by a decrease or increase in VCO tail current. For example, when increasing the coupling tail current, the VCO tail current is decreased, and vice versa.

According to the execution of this inventive aspect in FIG. 2, an NMOS transistor Q15 is driven from the control voltage Vc. Transistor Q17 provides a current source for transistors Q15, Q16, forming a current mirror. The current at the drain of Q17 is shared by Q15, Q16. When the current from Q17 is directed more to either Q15 or Q16, the current available to the other is decreased. Transistor Q15 is driven together with the coupling tail current controls Q18, Q19 from the control voltage Vc. Transistor Q16 is coupled to the VCO tail current controls Q20, Q21 and is indirectly controlled by control voltage Vc because the current available to transistor Q16 is decreased when control voltage Vc instead causes transistor Q15 to sink current available from Q17. In this way Q18 and Q19, namely the coupling tail current controls, are driven in the opposite direction as compared to the drive on Q20, Q21, namely the VCO tail current controls, so that if the tail current of the coupling controls increases, then the tail current of the VCOs decreases, and vice versa.

In this embodiment, the voltage control input is supplied at Vc to transistor Q15 and to the gate of coupling current transistors Q18, Q19. As the level of Vc increases, the tail currents (e.g., the drain-source current of transistors Q18 and Q19) of the coupling circuits 21 and 22 increase. On the other hand, as the control voltage at Vc is increased, the drain-source current of transistor Q15 increases. The increase of the drain-source current of Q15 consumes an increment of the drain-source current of Q17 which results in an increment of the gate-source voltage (Vgs) drop of Q17. The increased Vgs voltage drop at Q17 reduces the gate voltage applied to Q16. The reduced gate voltage at Q16 results in a smaller drain-source current of transistor Q16 and thus a smaller tail current for the VCO (e.g., drain-source current of Q20 and Q21).

To summarize, the inventive circuit is configured such that varying Vc simultaneously increases the level of current in the coupling circuits and decreases the level of current in the VCO tail current path, and vice versa. The coupling coefficient is proportional to the square root of the respective current ratios. Increasing the control voltage Vc enhances the change in the ratio by increasing the numerator and decreasing the denominator. An increased value for the coupling coefficient is thus obtained without necessitating a proportionately equal increase in VCO tail current. The same considerations apply to both VCO stages as shown.

According to the invention as shown in FIG. 2, the coupling circuit tail current tuning elements and the VCO tail current tuning elements are operated alternately. In addition, according to the invention, the coupling circuit tail current tuning and the VCO tail current tuning are coordinated to occur in opposite directions (increasing one while decreasing the other and vice versa), achieving an enhanced effect (increase or decrease) on the coupling coefficient.

The invention is applicable to an oscillator arrangement having two voltage controlled oscillators, each with an amplifier producing an output signal an dissipating a series current (tail current), and a summing node through which a control signal and the output signal are coupled in a feedback loop, wherein the two oscillators are cross coupled by two couplers. This coupling is such that the couplers controllably insert a portion of the output signal from one of the oscillators into the summing node of the other of the oscillators to achieve output signals synchronously with a phase difference, in particular the quadrature phase conditions described in the background section above.

Two pairs of bias current controls are provided. One pair of bias current controls adjusts the tail current through the oscillators. The other pair of bias current controls adjusting the current through the coupling circuits and thereby adjusts the coupling coefficient. As stated above, the controls are operated at equal levels.

However according to an inventive aspect, a controller is coupled to these bias current controls. The controller proportions available control currents so that the tail current levels of the oscillators and the coupling circuits are alternately and oppositely varied so that if one is caused to increase, the other is caused to decrease and vice versa.

In the exemplary embodiment, the oscillators each comprise complementary PMOS and NMOS negative resistance pairs coupled to at least one tank circuit. However, the invention is applicable to other coupled oscillator arrangements wherein oscillator current dissipation and coupling circuit current dissipation can be balanced against one another as described. Similarly, the output signals of the respective oscillators are synchronous quadrature signals. This is a useful but nonlimiting application of the invention.

Although exemplary circuits are shown for purposes of illustration, the invention can be considered a method for operating a complementary voltage controlled oscillator of the type having oscillators that are cross coupled by couplers defining coupling coefficients and are current controlled by tail current switches. This method includes the steps of providing couplers that are driven to alter the coupling coefficient between the oscillators and providing tail current controls for the couplers and also for the oscillators themselves. The couplers and the tail current transistors are operated in opposite directions during changes in the control level (i.e., when tuning for oscillator frequency). That is, increasing the coupler tail current is arranged, preferably using the same control circuit, to decrease the oscillator tail current. The invention as discussed above uses the proportioning of available current between two sides of a current mirror to accomplish this coordination. The effect is that the total current loading (the sum of all the biasing currents drawn from the power supply) remains limited over the range of controllable frequencies of oscillation, rather than having certain points in the range where the power dissipation is greater than at other points.

In the example discussed, the variation of the control bias (tail current) in an opposite direction from the oscillator bias (tail current) is accomplished by proportioning a common current supply in a current mirror arrangement. It would be possible to employ other particular circuits to achieve the same desired effect of opposite tuning of the coupling control tail currents versus the oscillator tail currents.

The invention has been disclosed in connection with exemplary embodiments that demonstrate the invention and its representative functions. The invention is not limited to these examples. Reference should be made to the appended claims rather than the discussion of examples in order to determine the scope of the invention in which exclusive rights are claimed.

What is claimed is:

1. An oscillator arrangement, comprising:
   two voltage controlled oscillators, each said oscillator producing an output signal, wherein the two oscillators are cross coupled by two couplers, each of the couplers controllably inserting a portion of a respective said output signal from one of said oscillators into a summing node coupled to an input of the other of said oscillators according to a coupling coefficient, and wherein the oscillators produce respective said output signals synchronously with a phase difference;

two pairs of bias current controls, one pair of said bias current controls being coupled in series with respective ones of the oscillators for adjusting a tail current through said oscillators, and the other pair of said bias current controls being coupled in series with respective said couplers and adjusting the coupling coefficient at each of the couplers;

a control coupled to the bias current controls, wherein the control is operable upon a change in coupling coefficient at the couplers to produce an opposite change in the tail current through the oscillators, increasing one when decreasing the other, and vice versa.

2. The oscillator arrangement of claim 1, wherein the oscillators comprise substantially identical LC resonant oscillators driven with equal coupling coefficients to produce quadrature phase outputs, and wherein variation of the coupling coefficients varies a frequency of oscillation over a control range.

3. The oscillator arrangement of claim 1, wherein the oscillators each comprise transistor pairs coupled to at least one tank circuit.

4. The oscillator arrangement of claim 1, wherein the coupling coefficients for said oscillators are varied in unison with coupling control circuits comprising at least one coupler tail current control transistor.

5. The oscillator arrangement of claim 4, wherein the coupler tail current control transistor is disposed in series with at least one transistor coupled between the oscillators, such that the tail current control transistor controls a tail current level that biases said at least one transistor coupled between the oscillators.

6. The oscillator arrangement of claim 5, further comprising at least one oscillator tail current control transistor disposed in series with each of said oscillators, such that the oscillator tail current control transistor controls a tail current level that biases the oscillators.

7. The oscillator arrangement of claim 6, further comprising a current supply configured to supply current to mirror-coupled transistors respectively controlling the coupler tail current transistor and the oscillator tail current control transistor, wherein the bias current controls proportion said current to the mirror-coupled transistors so as to increase bias of one of said couplers and said oscillators when decreasing bias of the other of said couplers and said oscillators.

8. A method for operating a complementary voltage controlled oscillator having two equal oscillators that are cross coupled by two equally biased couplers defining coupling coefficients and wherein the couplers and the oscillators are current controlled by tail current controls, comprising the steps of:

applying to the couplers equal control signals so as to tune an oscillation frequency of the oscillators;

adjusting biasing of the couplers by controlling a tail current of the couplers, while also adjusting biasing the oscillators by controlling a tail current of the oscillators, wherein said biasing of the couplers and of the oscillators is adjusted in opposite directions by reducing the tail current of one of the couplers versus the oscillators, while increasing the tail current of the other of the couplers versus the oscillators, and vice versa, whereby current dissipation is limited over a range of controllable frequencies of oscillation.

9. The method of claim 8, comprising providing a control current mirror with a supply current and apportioning the supply current to tune one of the coupler tail current and the oscillator tail current, thereby reducing a level of the supply current apportioned to tuning the other of the coupler tail current and the oscillator tail current.

10. The method of claim 8, wherein the oscillators comprise complementary transistors and the couplers comprise differential transistor pairs coupled between the transistors of the oscillators, comprising disposing tail current controls in series with the oscillators and in series with the couplers, respectively.

* * * * *